(12) United States Patent
Nagatomo et al.

(10) Patent No.: US 10,566,209 B2
(45) Date of Patent: Feb. 18, 2020

(54) ETCHING METHOD AND WORKPIECE PROCESSING METHOD

(71) Applicant: Tokyo Electron Limited, Tokyo (JP)

(72) Inventors: Yu Nagatomo, Miyagi (JP); Yoshihide Kihara, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/118,982

(22) Filed: Aug. 31, 2018

(65) Prior Publication Data

US 2019/0074191 A1  Mar. 7, 2019

(30) Foreign Application Priority Data

Sep. 4, 2017  (JP) .................. 2017-169464

(51) Int. Cl.
*H01L 21/311* (2006.01)
*H01J 37/32* (2006.01)
*H01L 21/033* (2006.01)
*H01L 21/285* (2006.01)

(52) U.S. Cl.
CPC .. *H01L 21/31144* (2013.01); *H01J 37/32091* (2013.01); *H01J 37/32724* (2013.01); *H01L 21/0332* (2013.01); *H01L 21/0337* (2013.01); *H01L 21/28568* (2013.01); *H01L 21/31116* (2013.01); *H01J 2237/002* (2013.01); *H01J 2237/334* (2013.01); *H01J 2237/3321* (2013.01)

(58) Field of Classification Search
None
See application file for complete search history.

(56) References Cited

U.S. PATENT DOCUMENTS

| 4,595,608 | A  | * | 6/1986  | King  | C23C 16/04 |
| | | | | | 257/E21.171 |
| 6,630,201 | B2 | * | 10/2003 | Chiang | C23C 16/0227 |
| | | | | | 427/248.1 |
| 9,659,788 | B2 | * | 5/2017  | Surla | H01L 21/31127 |
| 10,256,109 | B2 | * | 4/2019  | Surla | H01L 21/31127 |
| 2002/0146511 | A1 | * | 10/2002 | Chiang | C23C 16/0227 |
| | | | | | 427/248.1 |
| 2008/0160778 | A1 | * | 7/2008  | Nam | H01L 21/0332 |
| | | | | | 438/710 |
| 2013/0059450 | A1 | | 3/2013  | Le Gouil et al. | |
| 2015/0371869 | A1 | * | 12/2015 | Surla | H01L 21/31127 |
| | | | | | 438/723 |
| 2017/0110336 | A1 | * | 4/2017  | Hsu | H01L 21/31116 |

(Continued)

*Primary Examiner* — David E Graybill
(74) *Attorney, Agent, or Firm* — Pearne & Gordon LLP

(57) ABSTRACT

An etching method can protect a mask with a material having higher etching resistance to a silicon-containing film. The etching method is performed in a state that a processing target object is placed within a chamber main body. The etching method includes forming a tungsten film on the processing target object and etching the silicon-containing film of the processing target object. The forming of the tungsten film includes supplying a gaseous tungsten-containing precursor onto the processing target object; and generating plasma of a hydrogen gas to supply active species of hydrogen to the precursor on the processing target object. In the etching of the silicon-containing film, plasma of a processing gas containing fluorine, hydrogen and carbon is generated within the chamber main body.

18 Claims, 10 Drawing Sheets

(56) References Cited

U.S. PATENT DOCUMENTS

| | | | |
|---|---|---|---|
| 2017/0178923 A1* | 6/2017 | Surla | H01L 21/31116 |
| 2017/0229316 A1* | 8/2017 | Surla | H01L 21/31127 |
| 2018/0211845 A1* | 7/2018 | Hsu | H01L 21/76802 |
| 2019/0074191 A1* | 3/2019 | Nagatomo | H01J 37/32724 |

* cited by examiner

ETCHING METHOD AND WORKPIECE PROCESSING METHOD

CROSS-REFERENCE TO RELATED APPLICATION

This application claims the benefit of Japanese Patent Application No. 2017-169464 filed on Sep. 4, 2017, the entire disclosures of which are incorporated herein by reference.

TECHNICAL FIELD

The various aspects and embodiments described herein pertain generally to an etching method.

BACKGROUND

In the manufacture of an electronic device, a silicon-containing film is etched by plasma. The silicon-containing film is made of a silicon-containing material such as silicon oxide or silicon nitride. The manufacture of a NAND type flash memory having a three-dimensional structure involves etching of a silicon-containing multilayered film having a plurality of silicon oxide films and a plurality of silicon nitride films alternately stacked on top of each other. The silicon-containing film is etched using a carbon-containing mask such as amorphous carbon mask. The mask has openings.

Patent Document 1 describes etching of the multilayered film. The multilayered film is etched by fluorine active species from the plasma generated using hydrofluorocarbon gas. A carbon-containing deposit that is formed on the mask protects the mask during the etching.

Patent Document 1: US Patent Application Publication No. 2013/0059450

SUMMARY

In one exemplary embodiment, there is provided an etching method of etching a silicon-containing film. The silicon-containing film has a single silicon oxide film or has multiple silicon oxide films and multiple silicon nitride films alternately stacked on top of each other. The etching method is performed in a state that a processing target object having the silicon-containing film is placed within a chamber main body of a plasma processing apparatus. The processing target object further includes a mask provided on the silicon-containing film. The mask contains carbon and is provided with an opening. The etching method includes forming a tungsten film on the processing target object and etching the silicon-containing film. The forming of the tungsten film includes supplying a precursor gas containing tungsten onto the processing target object to allow a precursor containing the tungsten to be deposited on the processing target object; and generating plasma of a hydrogen gas to supply active species of hydrogen to the precursor on the processing target object. In the etching of the silicon-containing film, plasma of a processing gas containing fluorine, hydrogen and carbon is generated within the chamber main body to etch the silicon-containing film.

In the etching method, the tungsten film is formed on the mask. Accordingly, during the etching, the mask is protected by the material having higher etching resistance than the carbon-containing material. When forming the tungsten film by an atomic layer deposition method without using the plasma, the temperature of the processing target object is typically set to be equal to or higher than 250° C. to make a reaction for removing impurities in the precursor. Meanwhile, in the etching method according to the exemplary embodiment, since the tungsten film is formed as the impurities in the precursor are removed by the active species of the hydrogen from the plasma of the hydrogen gas, the processing target object can be set to be of the low temperature while forming the tungsten film. Here, an etching rate of the silicon-containing film increases as the temperature of the processing target object decreases. Thus, in the etching method, by setting the temperature of the processing target object while forming the tungsten film and the temperature of the processing target object while etching the silicon-containing film to be relatively low, a difference between the temperature of the processing target object while forming the tungsten film and the temperature of the processing target object while etching the silicon-containing film can be reduced. Therefore, between the forming of the tungsten film and the etching of the silicon-containing film, the temperature of the processing target object need not be changed, or a time required to change the temperature of the processing target object can be shortened. As a result, a throughput of the process including the forming of the tungsten film and the etching of the silicon-containing film can be increased.

The forming of the tungsten film and the etching of the silicon-containing film are repeated alternately.

The supplying of the precursor gas and the generating of the plasma of the hydrogen gas are repeated alternately in the forming of the tungsten film.

The temperature of the processing target object is set to be equal to or less than 0° C. in the forming of the tungsten film and in the etching of the silicon-containing film. The temperature of the processing target object is set to be equal to or less than −20° C. in the forming of the tungsten film and in the etching of the silicon-containing film.

The precursor gas is a halogenated tungsten gas. The precursor gas is a tungsten hexafluoride gas.

As described above, it is possible to protect the mask with a material having higher etching resistance during the etching of the silicon-containing film.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
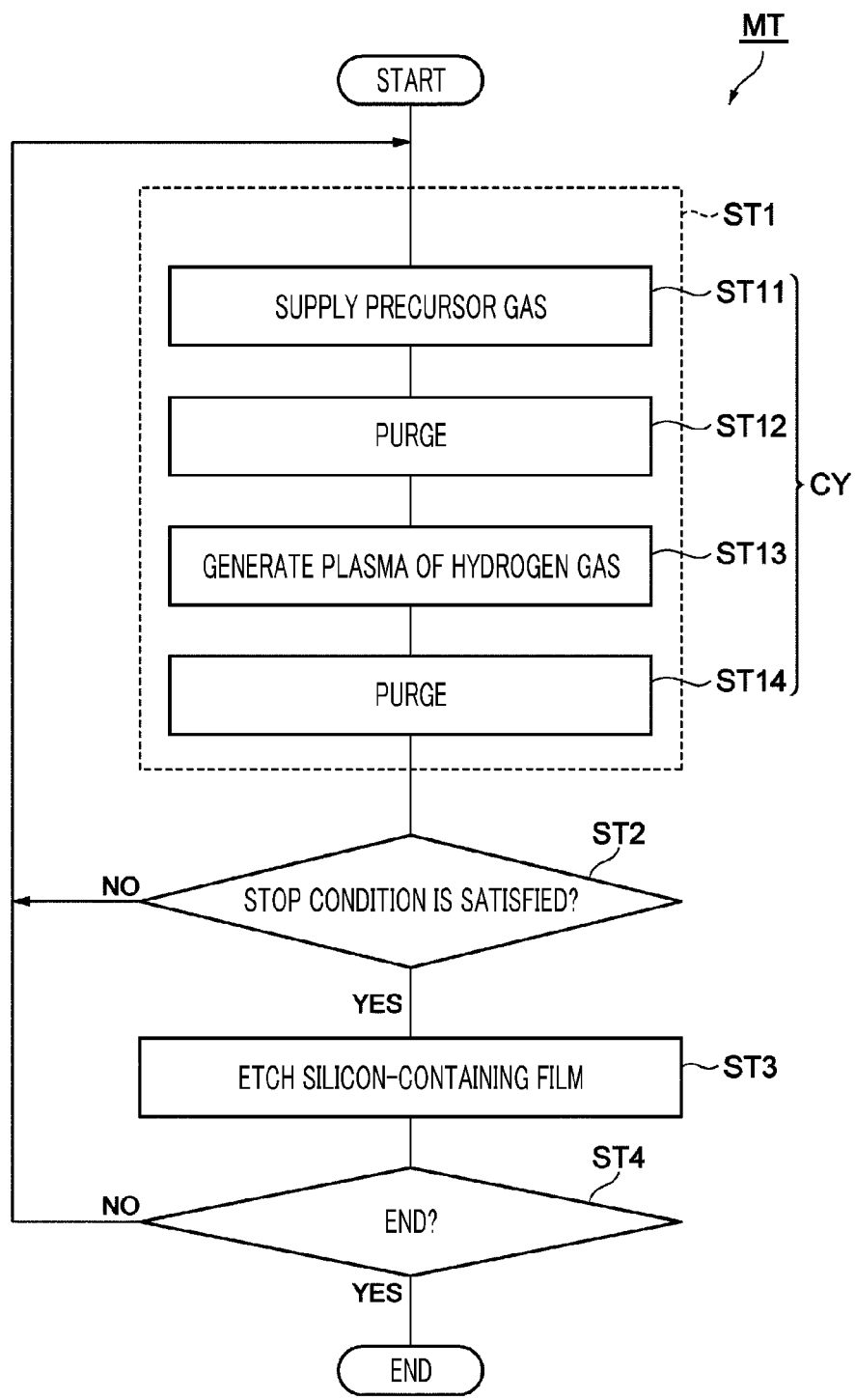
FIG. 1 is a flowchart illustrating an etching method according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

It is required to form an opening having a high aspect ratio or a deep opening in a silicon-containing film such as a multilayered film or a single silicon oxide film. To form such an opening in the silicon-containing film, a mask needs to be protected with a material having higher etching resistance during the etching of the silicon-containing film.

Hereinafter, various exemplary embodiments will be described in detail with reference to the accompanying drawings. In the various drawings, same or corresponding parts will be assigned same reference numerals.

Figure 2:
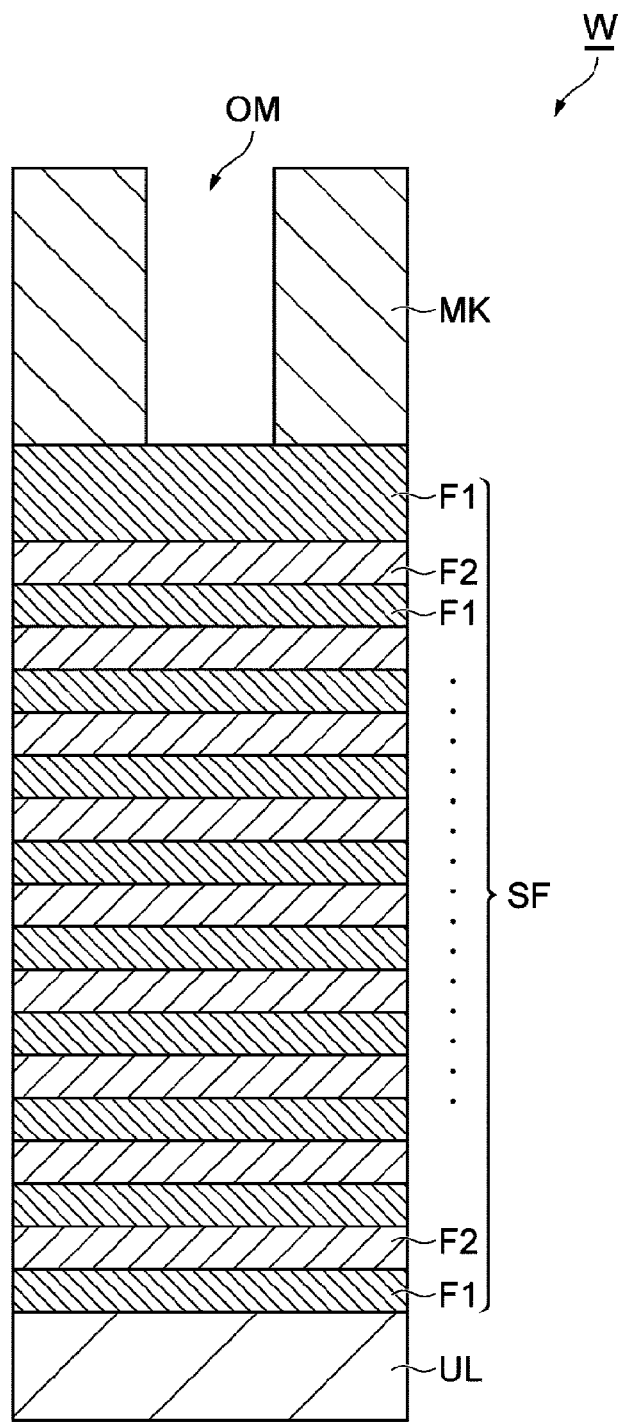
FIG. 2 is a partially enlarged cross sectional view of an example of a processing target object to which the etching method shown in FIG. 1 is applicable.

FIG. 1 is a flowchart for describing an etching method according to an exemplary embodiment. The etching method (hereinafter, referred to as "method MT") shown in FIG. 1 etches a silicon-containing film. FIG. 2 is a partially enlarged cross sectional view of an example of a processing target object (workpiece) to which the etching method shown in FIG. 1 is applicable. An example processing target object W shown in FIG. 2 has a silicon-containing film SF on an underlying layer UL.

The silicon-containing film SF has a multiple number of first films F1 and a multiple number of second films F2. The first films F1 and the second films F2 are alternately stacked on top of each other. The first films F1 are made of silicon oxide, and the second films F2 are made of silicon nitride. That is, the processing target object W has the multiple number of silicon oxide films and the multiple number of silicon nitride films alternately stacked on top of each other. In the example shown in FIG. 2, the first film F1 is the bottommost film provided directly on top of the underlying layer UL. In some embodiments, the second film F2 may be the bottommost film provided directly on top of the under-lying layer UL. Further, in the example shown in FIG. 2, the first film F1 is the topmost film provided directly under a mask MK. In some embodiments, the second film F2 may be the topmost film provided directly under the mask MK.

The processing target object W further includes the mask MK on the silicon-containing film SF. The mask MK is made of a material containing carbon. For example, the mask MK may be made of amorphous carbon. The mask MK includes an opening OM. A surface of the silicon-containing film SF is partially exposed through the opening OM. The opening OM includes a hole or a trench. The method MT etches the silicon-containing film SF with plasma to transfer a pattern of the mask MK.

Now, the method MT will be explained for an example case where the method MT is applied to the processing target object W shown in FIG. 2. Here, however, the processing target object to which the method MT is applicable is not limited to the example shown in FIG. 2. The method MT is performed in a state where the processing target object W is placed within a chamber main body of a plasma processing apparatus.

Figure 3:
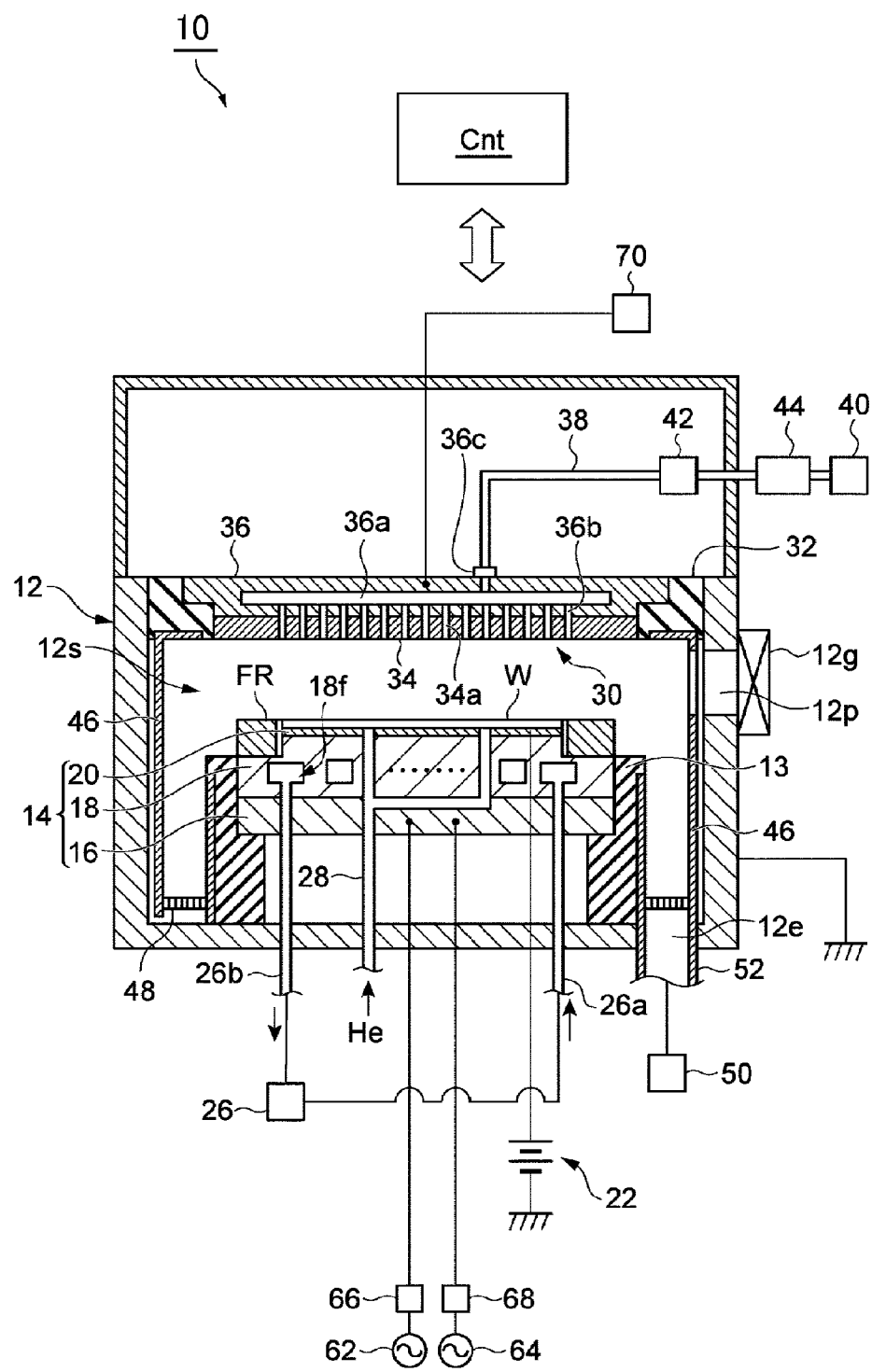
FIG. 3 is a diagram illustrating an example of a plasma processing apparatus which can be used to perform the etching method shown in FIG. 1.

FIG. 3 illustrates a plasma processing apparatus to perform the etching method shown in FIG. 1. A plasma processing apparatus 10 shown in FIG. 3 is configured as a capacitively coupled plasma etching apparatus. The plasma processing apparatus 10 has a chamber main body 12. The chamber main body 12 has a substantially cylindrical shape and provides an internal space 12s. In some embodiments, the chamber main body 12 is made of aluminum. A plasma-resistance treatment is performed on an inner wall surface of the chamber main body 12. For example, the inner wall surface of the chamber main body 12 is anodically oxidized. The chamber main body 12 is electrically grounded.

A passage 12p is formed at a sidewall of the chamber main body 12. When the processing target object W is carried into or out of the internal space 12s, the processing target object W passes through this passage 12p. The passage 12p is configured to be opened or closed by a gate valve 12g.

A supporting member 13 is provided on a bottom of the chamber main body 12. The supporting member 13 is made of an insulating material. The supporting member 13 has a substantially cylindrical shape. The supporting member 13 is upwardly extended from the bottom of the chamber main body 12 within the internal space 12s. The supporting member 13 supports a stage 14. The stage 14 is provided within the internal space 12s.

The stage 14 includes a lower electrode 18 and an electrostatic chuck 20. The stage 14 may further include an electrode plate 16. In some embodiments, the electrode plate 16 with a substantially disk shape is made of a conductive material such as aluminum. The lower electrode 18 is provided on the electrode plate 16. In some embodiments, the lower electrode 18 with a substantially disk shape is made of a conductive material such as aluminum. The lower electrode 18 is electrically connected with the electrode plate 16.

The electrostatic chuck 20 is provided on the lower electrode 18. The processing target object W is placed on a top surface of the electrostatic chuck 20. The electrostatic chuck 20 has a main body made of a dielectric material. A film-shaped electrode is provided within the main body of the electrostatic chuck 20. The electrode of the electrostatic chuck 20 is connected to a DC power supply 22 via a switch. If a voltage from the DC power supply 22 is applied to the electrode of the electrostatic chuck 20, an electrostatic attractive force is generated between the electrostatic chuck 20 and the processing target object W. The processing target object W is attracted to and held by the electrostatic chuck 20 with the generated electrostatic attractive force.

A focus ring FR is provided on a peripheral portion of the lower electrode 18 to surround an edge of the processing target object W. The focus ring FR is configured to improve etching uniformity. The focus ring FR may be made of, but not limited to, silicon, silicon carbide or quartz.

A path 18f is formed within the lower electrode 18. A coolant is supplied via a pipeline 26a into the path 18f from a chiller unit 26 provided at an outside of the chamber main body 12. The coolant supplied into the path 18f is returned back into the chiller unit 26 via a pipeline 26b. In the plasma processing apparatus 10, a temperature of the processing target object W placed on the electrostatic chuck 20 is adjusted by heat exchange between the coolant and the lower electrode 18.

The plasma processing apparatus 10 is equipped with a gas supply line 28. Through the gas supply line 28, a heat transfer gas, for example, a He gas from a heat transfer gas supply mechanism is supplied into a gap between the top surface of the electrostatic chuck 20 and a rear surface of the processing target object W.

The plasma processing apparatus 10 is further equipped with an upper electrode 30. The upper electrode 30 is disposed above the stage 14. The upper electrode 30 is supported at an upper portion of the chamber main body 12 with a member 32 therebetween. The member 32 is made of a material having insulation property. The upper electrode 30 may include a ceiling plate 34 and a supporting body 36. A bottom surface of the ceiling plate 34 is a surface at the side of the internal space 12s, and forms and confines the internal space 12s. The ceiling plate 34 may be made of a conductor or a semiconductor having low resistance with low Joule heat. The ceiling plate 34 is provided with a multiple number of gas discharge holes 34a. Each of these gas discharge holes 34a is formed through the ceiling plate 34 in a plate thickness direction.

The supporting body 36 is configured to support the ceiling plate 34 in a detachable manner, and is made of a conductive material such as, but not limited to, aluminum. A gas diffusion space 36a is formed within the supporting body 36. A multiple number of gas through holes 36b are extended downwards from the gas diffusion space 36a to communicate with the multiple number of gas discharge holes 34a, respectively. Further, the supporting body 36 is provided with a gas inlet port 36c through which a gas is introduced into the gas diffusion space 36a. A gas supply line 38 is connected to this gas inlet port 36c.

The gas supply line 38 is connected to a gas source group 40 via a valve group 42 and a flow rate controller group 44. The gas source group 40 includes a plurality of gas sources. These gas sources include sources of a plurality of gases constituting a processing gas used in the method MT. The valve group 42 includes a plurality of opening/closing valves. The flow rate controller group 44 includes a plurality of flow rate controllers. Each of the flow rate controllers may be implemented by a mass flow controller or a pressure control type flow rate controller. Each of the gas sources belonging to the gas source group 40 is connected to the gas supply line 38 via a corresponding valve belonging to the valve group 42 and a corresponding flow rate controller belonging to the flow rate controller group 44.

In the plasma processing apparatus 10, a shield 46 is provided along an inner wall of the chamber main body 12 in a detachable manner. The shield 46 is also provided on an outer side surface of the supporting member 13. The shield 46 is configured to suppress an etching byproduct from adhering to the chamber main body 12. By way of non-limiting example, the shield 46 may be made of an aluminum member coated with ceramic such as $Y_2O_3$.

A baffle plate 48 is provided between the supporting member 13 and the sidewall of the chamber main body 12. By way of non-limiting example, the baffle plate 48 may be made of an aluminum base member coated with ceramic such as $Y_2O_3$. This baffle plate 48 is provided with a multiple number of through holes. Under the baffle plate 48, a gas exhaust port 12e is provided at the bottom of the chamber main body 12. The gas exhaust port 12e is connected to a gas exhaust device 50 via a gas exhaust pipe 52. The gas exhaust device 50 has a pressure control valve and a vacuum pump such as a turbo molecular pump The plasma processing apparatus 10 is further equipped with a first radio frequency power supply 62 and a second radio frequency power supply 64. The first radio frequency power supply 62 is configured to generate a first radio frequency power for plasma generation. A frequency of the first radio frequency power is in a range from, but not limited to, 27 MHz to 100 MHz. The first radio frequency power supply 62 is connected to the lower electrode 18 via a matching device 66 and the electrode plate 16. The matching device 66 is equipped with a circuit configured to match an output impedance of the first radio frequency power supply 62 and an input impedance at a load side (lower electrode 18 side). Further, the first radio frequency power supply 62 may be connected to the upper electrode 30 via the matching device 66.

The second radio frequency power supply 64 is configured to generate a second radio frequency power for ion attraction into the processing target object W. A frequency of the second radio frequency power is lower than the frequency of the first radio frequency power and falls within a range from, by way of non-limiting example, 400 kHz to 13.56 MHz. The second radio frequency power supply 64 is connected to the lower electrode 18 via a matching device 68 and the electrode plate 16. The matching device 68 is equipped with a circuit configured to match an output impedance of the second radio frequency power supply 64 and the input impedance at the load side (lower electrode 18 side).

The plasma processing apparatus 10 may further include a DC power supply 70. The DC power supply 70 is connected to the upper electrode 30. The DC power supply 70 is configured to generate a negative DC voltage and apply this negative DC voltage to the upper electrode 30.

The plasma processing apparatus 10 may further include a control unit Cnt. The control unit Cnt is implemented by a computer including a processor, a storage unit, an input device, a display device, and so forth. The control unit Cnt controls individual components of the plasma processing apparatus 10. In the control unit Cnt, an operator can input commands through the input device to manage the plasma processing apparatus 10. Further, in the control unit Cnt, an operational status of the plasma processing apparatus 10 can be visually displayed on the display device. Furthermore, the storage unit of the control unit Cnt stores therein recipe data and a control program for controlling various processings performed in the plasma processing apparatus 10 by the processor. As the processor of the control unit Cnt executes the control program, the individual components of the plasma processing apparatus 10 are controlled based on the recipe data, so that the method MT is performed in the plasma processing apparatus 10.

Figure 4:
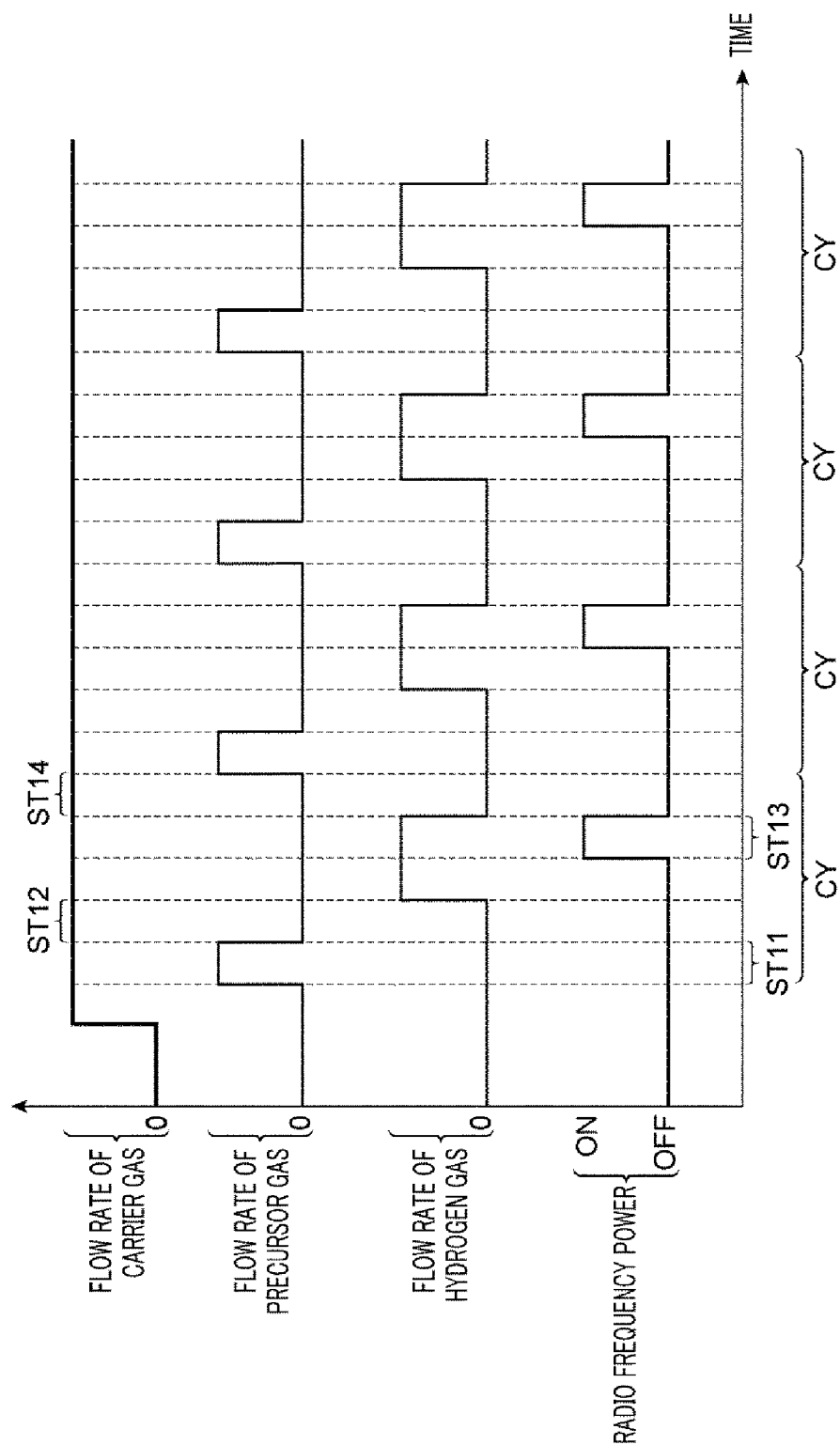
FIG. 4 is a timing chart of a process ST1 of the etching method shown in FIG. 1.
Figure 5:
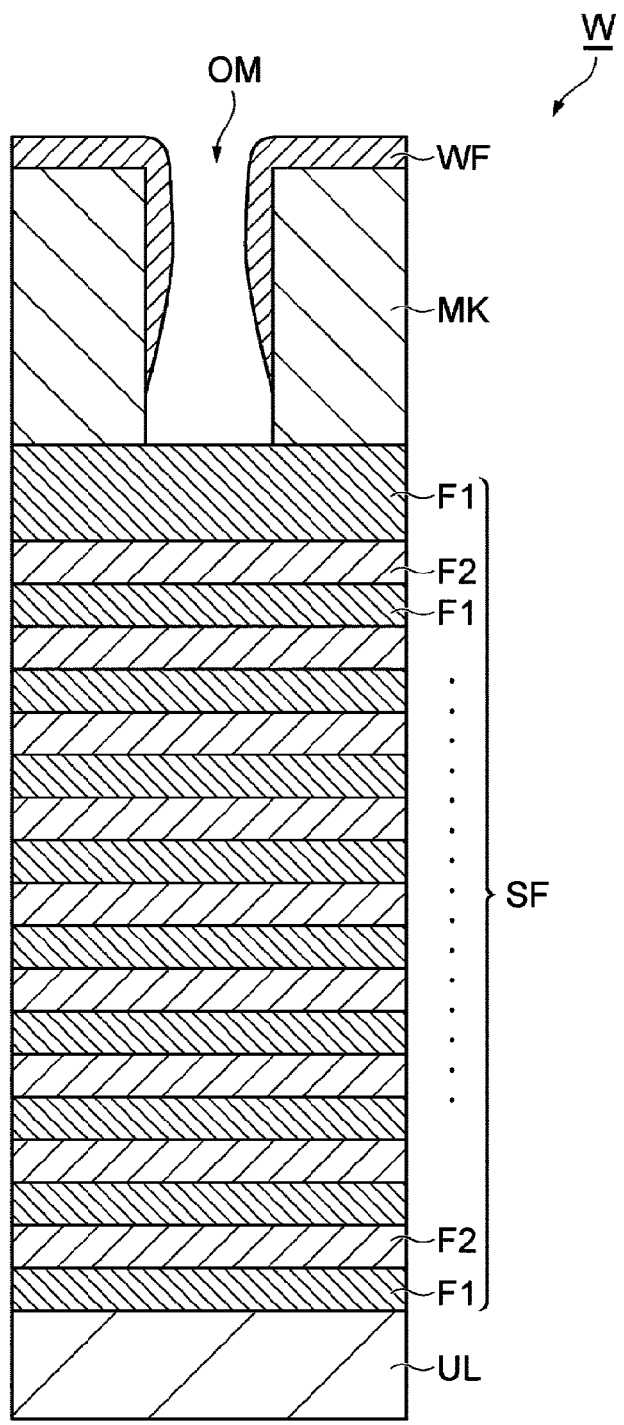
FIG. 5 is a partially enlarged cross sectional view of the processing target object with a tungsten film formed thereon while performing the etching method shown in FIG. 1.
Figure 6:
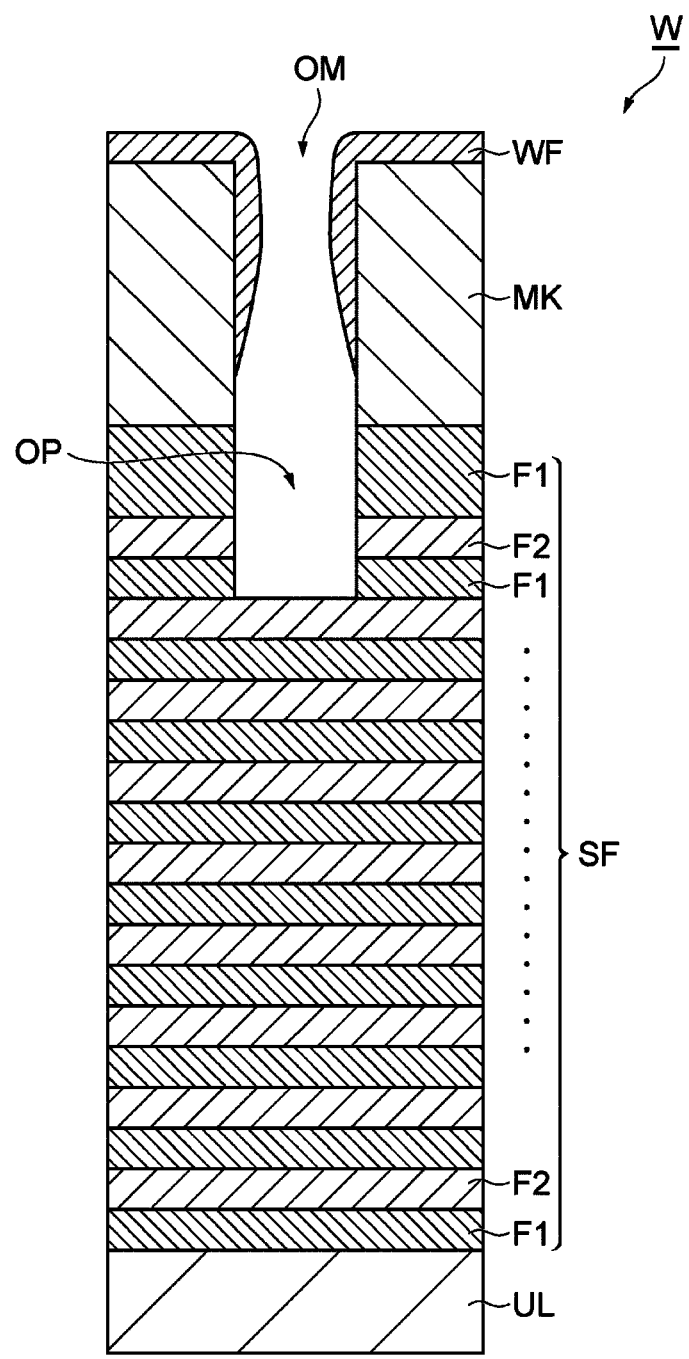
FIG. 6 is a partially enlarged cross sectional view of the processing target object in which the silicon-containing film is partially etched while performing the etching method shown in FIG. 1.
Figure 7:
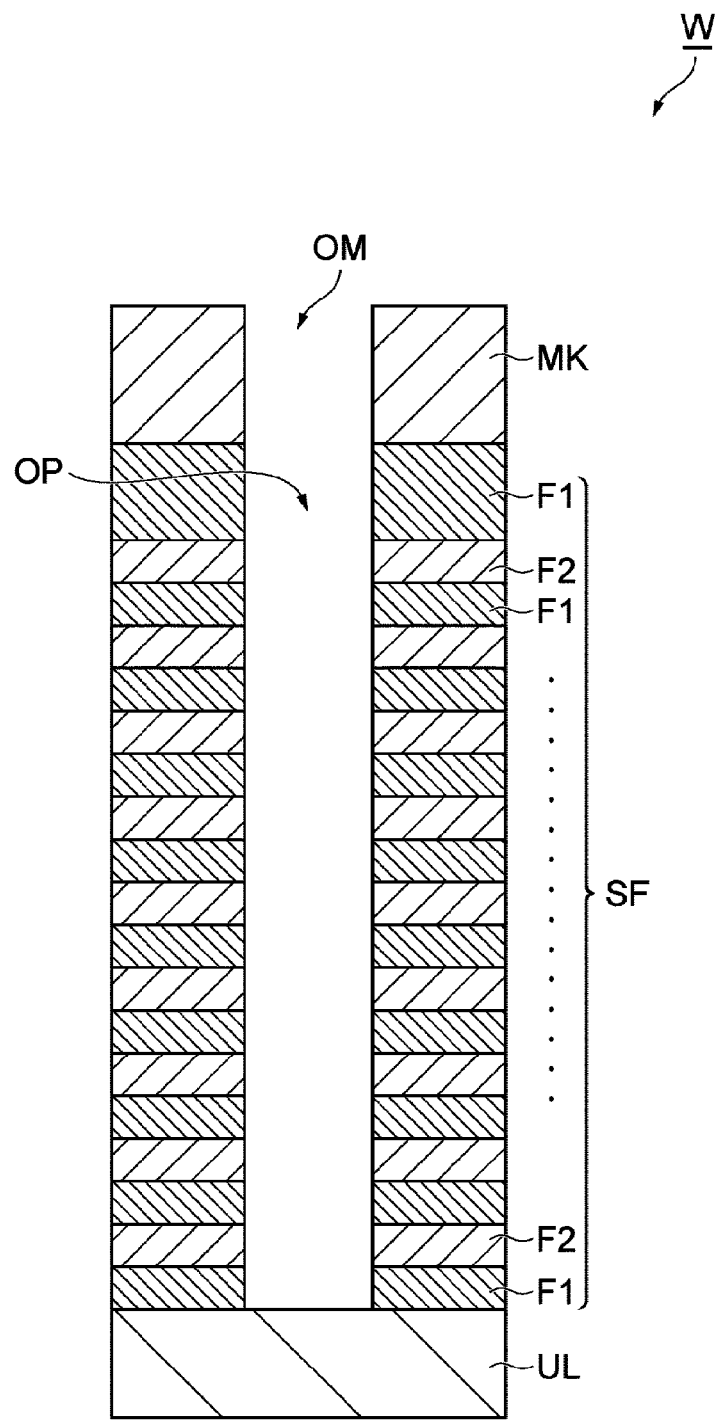
FIG. 7 is a partially enlarged cross sectional view of the processing target object after the etching method shown in FIG. 1 is completed.

Now, referring back to FIG. 1, the method MT will be explained for an example case where the plasma processing apparatus 10 is used. In some embodiments, the plasma processing apparatus used to perform the method MT is not limited to the plasma processing apparatus 10. In the following description, reference is made to FIG. 4 to FIG. 7 along with FIG. 1. FIG. 4 is a timing chart of a process ST1 of the etching method shown in FIG. 1. In FIG. 4, a horizontal axis represents a time, and a vertical axis represents a flow rate of a carrier gas, a flow rate of a precursor gas, a flow rate of a hydrogen gas and a state of a radio frequency power. In FIG. 4, "ON" of the radio frequency power indicates that at least the first radio frequency power is being supplied to generate plasma, and "OFF" of the radio frequency power indicates that the supply of the first radio frequency power and the second radio frequency power is stopped. FIG. 5 is a partially enlarged cross sectional view illustrating the processing target object with a tungsten film formed thereon while performing the etching method shown in FIG. 1. FIG. 6 is a partially enlarged cross sectional view of the processing target object in which a silicon-containing film is partially etched while performing the etching method shown in FIG. 1. FIG. 7 is a partially enlarged cross sectional view of the processing target object after the etching method shown in FIG. 1 is completed.

In the method MT, the process ST1 is performed. In the process ST1, a tungsten film WF is formed on the processing target object W. In the process ST1, to form the tungsten film WF, a cycle CY is performed one or more times. Each cycle CY includes a process ST11 and a process ST13. In case that the cycle CY is performed multiple times in the process ST1, the process ST11 and the process ST13 are performed alternately. According to the exemplary embodiment, each cycle CY further includes a process ST12 performed between the process ST11 and the process ST13. Further, each cycle CY further includes a process ST14 performed after the process ST13.

In the process ST11, a precursor gas is supplied onto the processing target object W to allow a tungsten containing precursor to be deposited on the processing target object W. That is, the precursor gas is supplied into the internal space 12s of the chamber main body 12. The precursor gas may be a halogenated tungsten gas. For example, the precursor gas may be a tungsten hexafluoride ($WF_6$) gas. For example, the precursor gas may be another halogenated tungsten gas such as a tungsten hexachloride gas, or may be another tungsten-containing gas. In the process ST11, plasma is not generated. That is, in the process ST11, the supply of the first radio frequency power and the second radio frequency power is stopped.

In the process ST11, a carrier gas may be supplied into the internal space 12s along with the precursor gas. The carrier gas may be a rare gas such as a He gas, a Ne gas, an Ar gas, a Xe gas or a Kr gas. In the exemplary embodiment, the carrier gas may be supplied into the internal space 12s throughout the process ST1, as shown in FIG. 4. In the process ST11, the flow rate of the precursor gas may be set to be in a range from 100 sccm to 300 sccm. In the process ST11, the flow rate of the carrier gas may be set to be in a range from 0 sccm to 3000 sccm. Further, in the process ST11, a pressure of the internal space 12s may be set to be in a range from 0.02 Torr (2.6 Pa) to 3 Torr (400 Pa).

In the subsequent process ST12, the internal space 12s is purged. To elaborate, in the process ST12, the internal space 12s is evacuated. In the process ST12, the carrier gas may be supplied into the internal space 12s as a purge gas. Through the process ST12, the precursor gas within the internal space 12s is exhausted, and the precursor excessively deposited on the processing target object W is removed.

In the subsequent process ST13, plasma of the hydrogen gas ($H_2$ gas) is generated within the internal space 12s to supply active species of hydrogen to the precursor on the processing target object W. To generate the plasma of the hydrogen gas in the process ST13, a supply of the hydrogen gas into the internal space 12s is started after the process ST12 is finished and before the process ST13 is begun, as depicted in FIG. 4. Further, after a lapse of a preset time from the beginning of the supply of the hydrogen gas, the process ST13 is begun. The supply of the hydrogen gas is continued until the end of the process ST13. When the hydrogen gas is supplied in the internal space 12s, the carrier gas may also be supplied into the internal space 12s.

In the process ST13, the first radio frequency power is supplied to the lower electrode 18 (or the upper electrode 30) in the state that the hydrogen gas is supplied in the internal space 12s. Accordingly, the plasma from the hydrogen gas is generated within the internal space 12s. In the process ST13, the second radio frequency power may be supplied to the lower electrode 18. In the process ST13, impurities within the precursor are removed by the active species of the hydrogen from the plasma, that is, ions and/or radicals of the hydrogen. In case that the precursor gas is the halogenated tungsten gas, a halogen element is removed from the precursor by a reaction between the halogen element within the precursor and the hydrogen.

In the process ST13, the flow rate of the hydrogen gas may be set to be in a range from 100 sccm to 3000 sccm. In the process ST13, the flow rate of the carrier gas may be set to be in a range from 0 sccm to 3000 sccm. In the process ST13, the pressure of the internal space 12s may be set to be in a range from 0.02 Torr (2.6 Pa) to 3 Torr (400 Pa). In the process ST13, the first radio frequency power may be set to be in a range from 20 W to 3000 W, and the second radio frequency power may be set to be in a range from 0 W to 200 W.

In a subsequent process ST14, the internal space 12s is purged. To elaborate, in the process ST14, the internal space 12s is evacuated. In the process ST14, the carrier gas may be supplied into the internal space 12s as a purge gas. Through the process ST14, the hydrogen gas within the internal space 12s is exhausted.

In the subsequent process ST2, it is determined whether a stop condition is satisfied. The stop condition is satisfied when a repetition number of the cycle CY reaches a preset number of times. The preset number of times is equal to or larger than 1. If it is determined in the process ST2 that the stop condition is not satisfied, the cycle CY is performed again. Meanwhile, if it is determined in the process ST2 that the stop condition is satisfied, the process ST1 is stopped. Through the process ST1, the tungsten film WF is formed on a surface of the processing target object W, particularly, on a surface of the mask MK (see FIG. 5).

In the present exemplary embodiment, the temperature of the processing target object W is set to be equal to or less than 0° C. in the process ST1. In another exemplary embodiment, the temperature of the processing target object W in the process ST1 is set to be equal to or less than −20° C. The temperature of the processing target object W is controlled by adjusting a temperature of the coolant supplied into the path 18f.

If the process ST1 is stopped, the processing proceeds to the process ST3. In the process ST3, plasma of a processing gas is generated within the chamber main body 12 to etch the silicon-containing film SF. The processing gas contains fluorine, hydrogen, and carbon. The processing gas may include one or more of a $H_2$ gas, a $C_xH_y$ gas (hydrogen carbide gas) and a $C_xH_yF_z$ gas (hydrofluorocarbon gas) as a hydrogen-containing gas. Further, the processing gas includes a fluorine-containing gas. The fluorine-containing gas includes one or more of a HF gas, a $NF_3$ gas, a $SF_6$ gas, a $WF_6$ gas, a $C_xF_y$ gas (fluorocarbon gas) and a $C_xH_yF_z$ gas. The processing gas includes one or more of a $C_xH_y$ gas (hydrogen carbide gas) and a $C_xH_yF_z$ gas (hydrofluorocarbon gas) as a carbon-containing gas. Here, x, y and z are natural numbers. Further, the processing gas may further include a halogen-containing gas such as a HBr gas. Furthermore, the processing gas may further include an oxygen-containing gas such as an $O_2$ gas, a CO gas or a $CO_2$ gas. In the present exemplary embodiment, the processing gas is a mixed gas of the hydrogen gas, the hydrofluorocarbon gas and the fluorine-containing gas.

In the process ST3, in a state that the processing gas is supplied in the internal space 12s, the first radio frequency power is supplied to the lower electrode 18 (or the upper electrode 30). Accordingly, the plasma of the processing gas is generated within the internal space 12s. In the process ST3, the second radio frequency power is supplied to the lower electrode 18. In the process ST3, a portion of the silicon-containing film SF exposed through the mask MK is etched by active species of fluorine from the plasma. As a result, an opening OP is formed in the silicon-containing film SF (see FIG. 6).

In the process ST3, the pressure of the internal space 12s is set to be in a range from 0.005 Torr (0.7 Pa) to 0.1 Torr (13.3 Pa). In the process ST3, the first radio frequency power may be set to be in a range from 500 W to 6000 W. Further, in the process ST3, the second radio frequency power may be set to be in a range from 0 W to 15000 W.

In the process ST3 according to the exemplary embodiment, the temperature of the processing target object W is set to be substantially equal to the temperature of the processing target object W in the process ST1. In the exemplary embodiment, the temperature of the processing target object W in the process ST3 is set to be equal to or less than 0° C. According to the exemplary embodiment, the temperature of the processing target object W in the process ST3 may be set to be equal to or less than −20° C. The temperature of the processing target object W is controlled by adjusting the temperature of the coolant supplied into the path 18f.

In the subsequent process ST4, it is determined whether or not to finish the method MT. In the process ST4, it is decided that the method MT be finished when a repetition number of a cycle including the process ST1 and the process ST3 reaches a preset number of times. The preset number of times is equal to or larger than 1. If it is determined in the process ST4 that the method MT is not to be finished, the cycle including the process ST1 and the process ST3 is performed again. Meanwhile, if the repetition of the method MT is stopped, the processing target object W is in a state as shown in FIG. 7, for example. In the state shown in FIG. 7, the opening OP extended to a surface of the underlying layer UL is formed in the silicon-containing film SF. In FIG. 7, illustration of the tungsten film WF is omitted.

In the method MT, the tungsten film WF is formed on the mask MK, as stated above. Accordingly, during the etching of the process ST3, the mask MK is protected by the material having higher etching resistance than the carbon-containing material. When forming the tungsten film by an atomic layer deposition method without using the plasma, the temperature of the processing target object is typically set to be equal to or higher than 250° C. to make a reaction for removing impurities in the precursor. Meanwhile, in the method MT, since the tungsten film WF is formed as the impurities in the precursor are removed by the active species of the hydrogen from the plasma of the hydrogen gas, the processing target object W in the process ST1 can be set to be of the low temperature. Here, an etching rate of the silicon-containing film SF increases as the temperature of the processing target object W decreases. Thus, in the method MT, by setting the temperature of the processing target object W in the process ST1 and the temperature of the processing target object W in the process ST3 to be relatively low, a difference between the temperature of the processing target object W in the process ST1 and the temperature of the processing target object W in the process ST3 can be reduced. Therefore, the temperature of the processing target object W need not be changed between the process ST1 and the process ST3, or a time required to change the temperature of the processing target object W therebetween can be shortened. As a result, a throughput of the process including the forming of the tungsten film WF and the etching of the silicon-containing film SF can be increased.

According to the exemplary embodiment, the cycle including the process ST1 and the process ST3 is performed multiple times. That is, the process ST1 and the process ST3 are performed alternately. According to this exemplary embodiment, the etching of the silicon-containing film SF can be performed while replenishing the tungsten on the mask MK. Further, if a film thickness of the mask MK is decreased as the etching of the silicon-containing film SF progresses, the tungsten film WF may be formed on a sidewall surface of the silicon-containing film SF directly under the mask MK. As a result, the silicon-containing film SF can be suppressed from being etched in a transversal direction directly under the mask MK.

So far, various exemplary embodiments have been described. However, the above-described exemplary embodiments are not limiting, and various changes and modifications may be made. By way of example, the method MT may be performed by using any of various kinds of plasma processing apparatuses such as an inductively coupled plasma processing apparatus and a plasma processing apparatus configured to generate plasma by a surface wave such as a microwave. Further, the silicon-containing film SF may be composed of only a single silicon oxide film.

Now, experiments conducted to evaluate the method MT will be discussed. Here, however, it should be noted once again that the experiments to be described below are not intended to be anyway limiting.

First Experiment

In the first experiment, silicon oxide films of multiple samples are etched. In the first experiment, temperatures of the silicon oxide films of the multiple samples during the etching are set to be different from each other. Each sample has an underlying layer; and the silicon oxide film formed on a flat surface of the underlying layer to have a uniform film thickness. The etching of these silicon oxide films is performed by using the plasma processing apparatus 10. Conditions for the etching in the first experiment are as follows.

Figure 8:
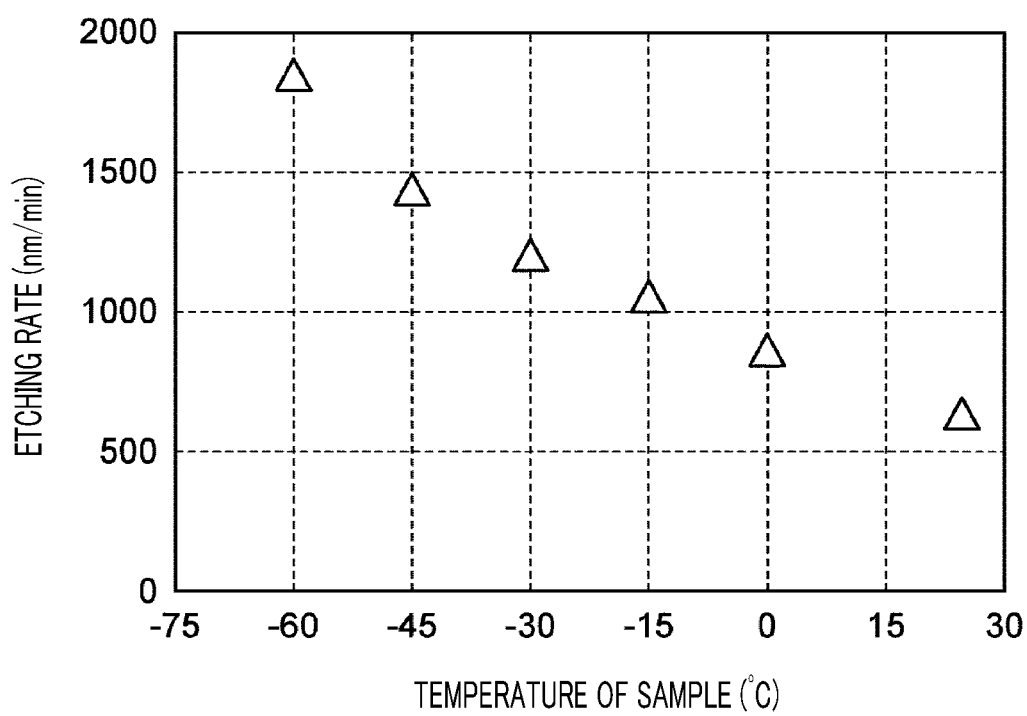
FIG. 8 is a graph showing a result of a first experiment.

<Etching Conditions in First Experiment>
Pressure of the internal space 12s: 25 mTorr (3,333 Pa)
First radio frequency power: 100 MHz, 2.3 kW
Second radio frequency power: 3 MHz, 1 kW
Processing gas: mixed gas of $H_2$ gas, $CF_4$ gas, $CH_2F_2$ gas and $NF_3$ gas In the first experiment, for each of the multiple samples, an etching rate of the silicon oxide film is calculated from an etching time and a decrement of the film thickness of the silicon oxide film. Further, a relationship between the temperature of the silicon oxide film during the etching and the etching rate of the silicon oxide film is also calculated. FIG. 8 shows a result of the first experiment. In FIG. 8, a horizontal axis represents the temperature of the sample, and a vertical axis represents the etching rate. As can be seen from FIG. 8, the etching rate of the silicon oxide film is found to be increased considerably when the temperature of the sample is equal to or less than 0° C. Further, the lower the temperature of the sample is, the higher the etching rate of the silicon oxide film is found to be. Through this first experiment, it is found out that the high etching rate of the silicon-containing film can be obtained by setting the temperature of the processing target object to be equal to or less than 0° C. Furthermore, it is also found out that the etching rate of the silicon-containing film increases as the temperature of the processing target object decreases.

Second Experiment

In the second experiment, by performing the process ST1, the tungsten film WF is formed on each of multiple samples WF. In the second experiment, temperatures of the multiple samples in the process ST1 are set to be different from each other. Each sample has the underlying layer; and a mask EMK formed on the underlying layer. The mask EMK is an amorphous carbon mask and has a line-and-space pattern. The plasma processing apparatus 10 is used to perform the process ST1. Conditions for the process ST1 in the second experiment are specified as follows.

Figure 9:
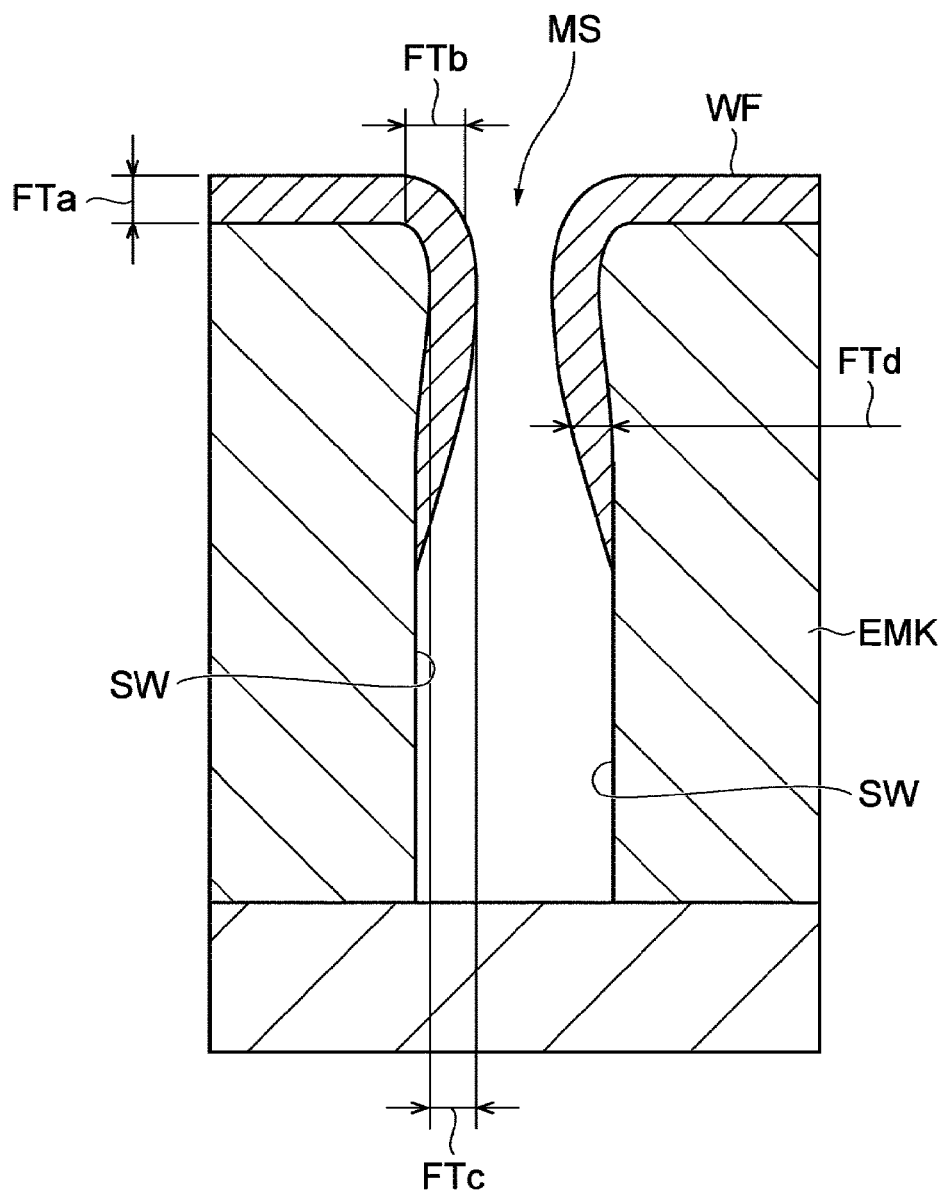
FIG. 9 is a diagram showing sizes measured in a second experiment.
Figure 10:
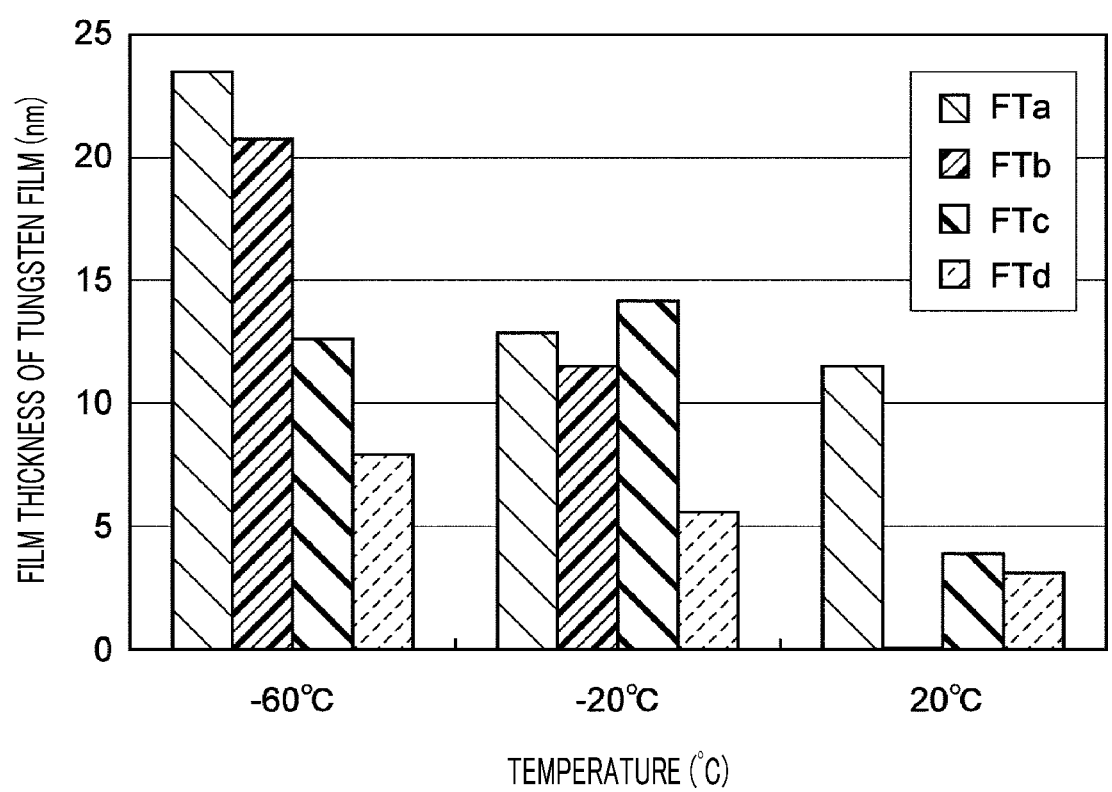
FIG. 10 is a graph showing a result of the second experiment.

<Conditions for Process ST1 in Second Experiment>
Process ST11
Pressure of the internal space 12s: 800 mTorr (107 Pa)
Flow rate of $WF_6$ gas: 170 sccm
Flow rate of carrier gas (Ar gas): 600 sccm
Processing time: 10 seconds
Process ST12
Pressure of the internal space 12s: 800 mTorr (107 Pa)
Flow rate of carrier gas (Ar gas): 800 sccm
Processing time: 30 seconds
Process ST13
Pressure of the internal space 12s: 800 mTorr (107 Pa)
Flow rate of $H_2$ gas: 500 sccm
Flow rate of carrier gas (Ar gas): 600 sccm
First radio frequency power: 100 MHz, 500 W
Second radio frequency power: 0 W
Processing time: 3 seconds
Process ST14
Pressure of the internal space 12s: 800 mTorr (107 Pa)
Flow rate of carrier gas (Ar gas): 800 sccm
Processing time: 30 seconds
Repetition number of cycle CY: 30 times FIG. 9 is a diagram showing sizes measured in the second experiment. In the second experiment, film thicknesses FTa, FTb, FTc and FTd of the tungsten film WF formed on each sample are respectively measured. The film thickness FTa is a film thickness of the tungsten film WF on a top surface of the mask EMK; the film thickness FTb, a film thickness of the tungsten film WF in a transversal direction on a transversal cross section including the top surface of the mask EMK; the film thickness FTc, a film thickness of the tungsten film WF in the transversal direction on a transversal cross section having a minimum width of a space MS provided by the mask EMK and the tungsten film WF; and the film thickness FTd, a film thickness of the tungsten film WF on a transversal cross section having a downward distance of 150 nm from the top surface of the mask EMK. FIG. 10 shows a result of the second experiment. In FIG. 10, a horizontal axis represents the temperature of the sample in the process ST1, and a vertical axis indicates the film thickness of the tungsten film. As can be seen from FIG. 10, it is found out that the tungsten film can be formed on the mask EMK through the process ST1 when the temperature of the sample is equal to or less than 20° C. That is, it is found out that, according to the process ST1, the tungsten film can be formed on the processing target object in the state that the temperature of the processing target object is set to a temperature considerably lower than the temperature (typically, equal to or higher than 250° C.) of the processing target object when the tungsten film is formed by the atomic layer deposition method without using plasma. Furthermore, it is also found out that the tungsten film having a large thickness can be formed in the state that the temperature of the processing target object is set to be equal to or less than −20° C. As found out by the first experiment and the second experiment described above, it is desirable to set the temperature of the processing target object W in the process ST1 and the process ST3 of the method MT to be equal to or less than 0° C. and, more desirably, equal to or less than −20° C.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:
1. An etching method of etching a silicon-containing film having a single silicon oxide film or having multiple silicon oxide films and multiple silicon nitride films alternately stacked on top of each other,
    wherein the etching method is performed in a state that a workpiece having the silicon-containing film is placed within a chamber main body of a plasma processing apparatus,
    the workpiece further includes a mask provided on the silicon-containing film, and
    the mask contains carbon and includes an opening,
    wherein the etching method comprises:
    forming a tungsten film on a region including a top surface of the mask; and
    etching the silicon-containing film,
    wherein the forming of the tungsten film comprises:
    supplying a gaseous tungsten-containing precursor onto the workpiece to form the tungsten-containing precursor on the workpiece; and
    generating plasma from a hydrogen-containing gas to supply hydrogen active species to the precursor on the workpiece, and
    in the etching of the silicon-containing film, plasma is generated from a processing gas containing fluorine, hydrogen, and carbon within the chamber main body to etch the silicon-containing film.

2. The etching method of claim 1,
wherein the forming of the tungsten film and the etching of the silicon-containing film are repeated alternately.

3. The etching method of claim 1,
wherein the supplying of the gaseous precursor and the generating of the plasma from the hydrogen-containing gas are repeated alternately in the forming of the tungsten film.

4. The etching method of claim 1,
wherein each of the forming of the tungsten film and the etching of the silicon-containing film includes setting a temperature of the workpiece to be equal to or less than 0° C.

5. The etching method of claim 4,
wherein each of the forming of the tungsten film and the etching of the silicon-containing film includes setting the temperature of the workpiece to be equal to or less than −20° C.

6. The etching method of claim 1,
wherein the gaseous precursor is a halogenated tungsten gas.

7. The etching method of claim 6,
wherein the gaseous precursor is a tungsten hexafluoride gas.

8. A workpiece processing method, comprising:
preparing a workpiece having a silicon-containing film and a mask provided on the silicon-containing film;
setting a temperature of the workpiece to be equal to or less than 20° C.; and
forming a tungsten-containing film on a region including a top surface of the mask,
wherein the forming of the tungsten-containing film comprises:
supplying a gaseous tungsten-containing precursor onto the workpiece to form the tungsten-containing precursor on the workpiece; and
generating plasma from a hydrogen-containing gas to supply hydrogen active species to the precursor on the workpiece.

9. The workpiece processing method of claim 8, further comprising
etching the silicon-containing film after the forming of the tungsten-containing film.

10. The workpiece processing method of claim 9,
wherein the forming of the tungsten-containing film and the etching of the silicon-containing film are performed in a same chamber main body.

11. The workpiece processing method of claim 8,
wherein the forming of the tungsten-containing film includes supplying a carrier gas.

12. The workpiece processing method of claim 8,
wherein the setting of the temperature of the workpiece includes setting the temperature of the workpiece to be equal to or less than 0° C.

13. The workpiece processing method of claim 8,
wherein the setting of the temperature of the workpiece includes setting the temperature of the workpiece to be equal to or less than −20° C.

14. The workpiece processing method of claim 8,
wherein the tungsten-containing film is formed on a top surface and a side surface of the mask.

15. An etching method of etching a silicon-containing film having a single silicon oxide film or having multiple silicon oxide films and multiple silicon nitride films alternately stacked on top of each other,
wherein the etching method is performed in a state that a workpiece having the silicon-containing film is placed within a chamber main body of a plasma processing apparatus,
the workpiece further includes a mask provided on the silicon-containing film, and
the mask contains carbon and includes an opening,
wherein the etching method comprises:
forming a tungsten film on a region including a top surface of the mask; and
etching the silicon-containing film,
wherein the forming of the tungsten film and the etching of the silicon-containing film are repeated alternately,
each of the forming of the tungsten film and the etching of the silicon-containing film includes setting a temperature of the workpiece to be equal to or less than 0° C.,
the forming of the tungsten film comprises:
supplying a gaseous tungsten-containing precursor onto the workpiece to form the tungsten-containing precursor on the workpiece; and
generating plasma from a hydrogen-containing gas to supply hydrogen active species to the gaseous precursor on the workpiece,
wherein the supplying of the gaseous precursor and the generating of the plasma from the hydrogen-containing gas are repeated alternately in the forming of the tungsten film,
the gaseous precursor is a halogenated tungsten gas, and
in the etching of the silicon-containing film, plasma is generated from a processing gas containing fluorine, hydrogen, and carbon within the chamber main body to etch the silicon-containing film.

16. The etching method of claim 1,
wherein a thickness of the tungsten film on a top surface of the mask is thicker than a thickness of the tungsten film on a bottom of the mask.

17. The workpiece processing method of claim 8,
wherein a thickness of the tungsten-containing film on a top surface of the mask is thicker than a thickness of the tungsten-containing film on a bottom of the mask.

18. The etching method of claim 16,
wherein the tungsten film is not formed on a surface of the silicon-containing film.

* * * * *